United States Patent
Ou (10) Patent No.: US 9,026,895 B2
(45) Date of Patent: May 5, 2015

(54) FLASH MEMORY CONTROLLERS AND ERROR DETECTION METHODS

(71) Applicant: Silicon Motion, Inc., Jhubei (TW)

(72) Inventor: Hsu-Ping Ou, Zhubei (TW)

(73) Assignee: Silicon Motion, Inc., Jhubei (TW)

( * ) Notice: Subject to any disclaimer, the term of this patent is extended or adjusted under 35 U.S.C. 154(b) by 329 days.

(21) Appl. No.: 13/750,459

(22) Filed: Jan. 25, 2013

(65) Prior Publication Data

US 2014/0019671 A1  Jan. 16, 2014

(30) Foreign Application Priority Data

Jul. 10, 2012 (TW) .............................. 101124724 A (51) Int. Cl.
*G06F 12/02* (2006.01)
*G06F 11/10* (2006.01)
*G11C 29/44* (2006.01)
*G06F 3/06* (2006.01)
*G11C 29/04* (2006.01)

(52) U.S. Cl.
CPC ............ *G06F 12/0246* (2013.01); *G06F 11/10* (2013.01); *G11C 29/44* (2013.01); *G11C 2029/0401* (2013.01); *G11C 2029/0409* (2013.01); *G11C 2029/0411* (2013.01); *G06F 3/0619* (2013.01); *G06F 3/0659* (2013.01); *G06F 3/0679* (2013.01)

(58) Field of Classification Search
CPC .............. G11C 2029/0401; G11C 2029/0409; G11C 29/44; G11C 2029/0411; G06F 12/0246; G06F 11/10; G06F 3/0679; G06F 3/0619; G06F 3/0659
See application file for complete search history.

(56) References Cited

U.S. PATENT DOCUMENTS

| 5,430,859 | A | * | 7/1995 | Norman et al. ................ 711/103 |
| 5,581,503 | A | * | 12/1996 | Matsubara et al. ....... 365/185.33 |
| 6,078,520 | A | * | 6/2000 | Tobita et al. ............ 365/185.09 |
| 7,302,517 | B2 | * | 11/2007 | Lim et al. ...................... 711/103 |
| 7,660,938 | B1 | * | 2/2010 | Chow et al. .................... 710/313 |
| 2011/0041005 | A1 | * | 2/2011 | Selinger ............................ 714/6 |
| 2011/0041039 | A1 | * | 2/2011 | Harari et al. ................... 714/773 |
| 2012/0203955 | A1 | * | 8/2012 | Kim et al. ..................... 711/103 |

* cited by examiner

*Primary Examiner* — John P Trimmings
(74) *Attorney, Agent, or Firm* — Wang Law Firm, Inc.; Li K. Wang; Stephen Hsu (57) ABSTRACT

A flash memory controller includes a read/write unit, a state machine, a processing unit, and an auxiliary unit. The read/write unit is connected to a flash memory and performs a writing command or a reading command. The state machine is configured to determine a state of the flash memory controller. The processing unit is connected to the read/write unit and the state machine and configured to control the read/write unit. The auxiliary unit is connected to a first data line and a second data line and the processing unit and configured to receive and store a string output from the processing unit. The auxiliary unit outputs the string through the first and second data lines when the flash memory controller completes a writing data transmission.

46 Claims, 7 Drawing Sheets

FLASH MEMORY CONTROLLERS AND ERROR DETECTION METHODS

CROSS REFERENCE TO RELATED APPLICATION

This Application claims priority to Taiwan Patent Application No. 101124724, filed on Jul. 10, 2012, the entirety of which is incorporated by reference herein.

BACKGROUND OF THE INVENTION

1. Field of the Invention

The present invention relates to flash memories, and in particular to imbedded flash memories.

2. Description of the Related Art

A non-volatile memory is generally used for many applications, for example, in solid-state disks (SSD), memory cards, digital cameras, digital video cameras, multimedia players, mobile phones, computers and other related electric devices.

However, when the processing data (i.e. firmware) stored in the flash memory is missing or damaged (or due to false design), the processing unit of the flash memory controller can not operate normally, such that the user can not read the content of the flash memory. Thus, there is a need for a flash memory controller which can analyze data in a flash memory and identify the locations of errors, when the processing data stored in the flash memory includes errors.

BRIEF SUMMARY OF INVENTION

A detailed description is given in the following embodiments with reference to the accompanying drawings.

The invention provides an embodiment of a flash memory controller. The flash memory controller comprises a read/write unit, a state machine, a processing unit, and an auxiliary unit. The read/write unit is connected to the flash memory and configured to perform a writing command or a reading command. The state machine is configured to determine a state of the flash memory controller. The processing unit is connected to the read/write unit and the state machine and configured to control the read/write unit. The auxiliary unit is connected to a first data line, a second data line and the processing unit, and configured to receive and store a string output from the processing unit. The auxiliary unit outputs the string through the first and second data lines when the flash memory controller completes a writing data transmission.

The invention also provides an embodiment of an error detection method suitable for a flash memory and a flash memory controller having a read/write unit, a state machine and a processing unit. The error detection method comprises receiving and storing a string from the processing unit by an auxiliary unit of the flash memory controller; determining a state of the flash memory controller by the state machine; and outputting the string through the first and second data lines by the auxiliary unit after a writing data transmission of the flash memory controller is completed.

The invention provides another embodiment of the flash memory controller. The flash memory controller comprises a read/write unit, a state machine, a processing unit, and an auxiliary unit. The read/write unit is connected to a flash memory and configured to perform a writing command or a reading command. The state machine is configured to determine a state of the flash memory controller. The processing unit is connected to the read/write unit and the state machine and configured to control the read/write unit. The auxiliary unit is connected to a first data line, a second data line and the processing unit and configured to receive and store a string from the processing unit. The auxiliary unit outputs the string through the first and second data lines before the flash memory controller enables a reading data transmission.

The invention also provides another embodiment of the error detection method. The error detection method comprises receiving and storing a string from the processing unit by an auxiliary unit of the flash memory controller; determining a state of the flash memory controller by the state machine; and transmitting the string through the first and second data lines by the auxiliary unit, before the flash memory controller enables a reading data transmission.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
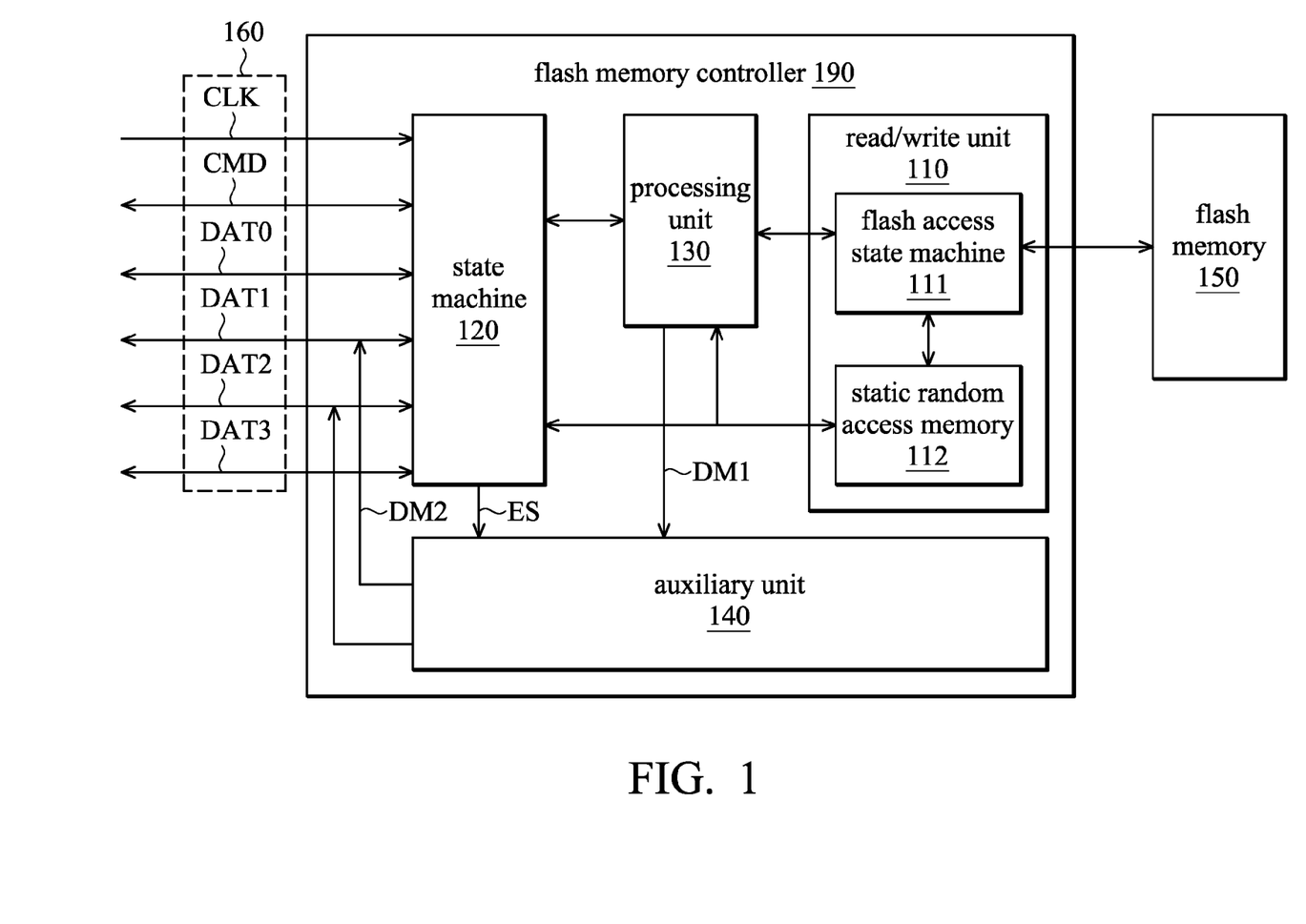
FIG. 1 is a schematic view showing a flash memory controller of the invention.

FIG. 1 is a schematic view showing a flash memory controller 190 of the invention. As shown in FIG. 1, the flash memory controller 190 comprises a read/write unit 110, a state machine 120, a processing unit 130 and an auxiliary unit 140. The read/write unit 110 is connected to the flash memory 150 and configured to perform a write command or a read command. The processing unit 130 is configured to control operations of the read/write unit 110, i.e., the processing unit 130 can control the read/write unit 110 to perform the writing command and the reading command.

Specifically, the read/write unit 110 comprises a flash access state machine 111 and a static random access memory (SRAM) 112. The flash access state machine 111 is coupled between the processing unit 130 and the flash memory 150 and is configured to perform a write command or a read command The flash memory 150 can be either a NAND gate flash memory or a NOR gate flash memory.

In addition, the flash access state machine 111 outputs an access signal to the flash memory 150. The access signal comprises a chip enabling signal (CE#), a command latch enabling signal (CLE), an address latch enabling signal (ALE), a writing enabling signal (WE#), a reading enabling signal (RE#) and a standby/busy signal (R/B#). The static random access memory 112 is coupled to the flash access state machine 111, the state machine 120 and the processing unit 130, and is configured to store data from the state machine 120 and the processing unit 130.

The state machine 120 is coupled between the processing unit 130 and a host 170 (such as, the host 270 in FIG. 2), and communicates with the host 170 via a transmission channel 160 compatible with the standard of the imbedded flash memory. In other words, the host 170 is the host of the imbedded flash memory. The state machine 120 is an embedded multimedia card (EMMC) state machine and/or a secure digital (SD) memory card (SD) state machine.

The state machine 120 is configured to determine the state of the flash memory controller 190. The processing unit 130 connects to the read/write unit 110 and state machine 120, and is configured to control the read/write unit 110. The auxiliary unit 140 is connected to the data line DAT1, the data line DAT2 and the processing unit 130, and is configured to receive and store an error correction message DM1, wherein the error correction message DM1 includes a string ST. The auxiliary unit 140 is suspended when receiving a sleeping signal. It should be noted that the transmission channel 160 includes a clock signal line CLK, a command signal line CMD and a plurality of data lines DAT0~DAT3, when the state machine 120 is a secure digital memory card state machine. The transmission channel 160 comprises a clock signal line CLK, a command signal line CMD and a plurality of data lines DAT0~DAT7, when state machine 120 is an embedded multi media card state machine.

When the flash memory controller 190 completes a writing data transmission (i.e. busy status cycle or cyclical redundancy check status), the state machine 120 outputs an enabling signal ES to the auxiliary unit 140. The auxiliary unit 140 outputs an error detection message DM2 (comprises the string ST) to an error detection device (such as the error detection device 280 in FIG. 2) through the data line DAT1 and the data line DAT2. To be more precise, the writing data transmission is completed to indicate that the transmission of the writing data on the data line DAT1 and the data line DAT2 is completed. In some embodiments, the auxiliary unit 140 can also be connected to a data line DAT0, and configured to determine whether the writing data transmission on the data lines DAT1 and DAT2 is completed according to the signal on the data line DAT0.

In some embodiments, the state machine 120 outputs the enabling signal ES to the auxiliary unit 140 and the auxiliary unit 140 outputs the string ST through the data lines DAT1 and DAT2, before the flash memory controller 190 enables the reading data transmission (such as in the access time delay). To be more precise, enabling the reading data transmission is to enable the reading data transmission on the data lines DAT1 and DAT2. In some embodiments, the auxiliary unit 140 can also be connected to the data line DAT0, and configured to determine whether the reading data transmission on the data lines DAT1 and DAT2 is enabled according to the signal on the data line DAT0.

Figure 2:
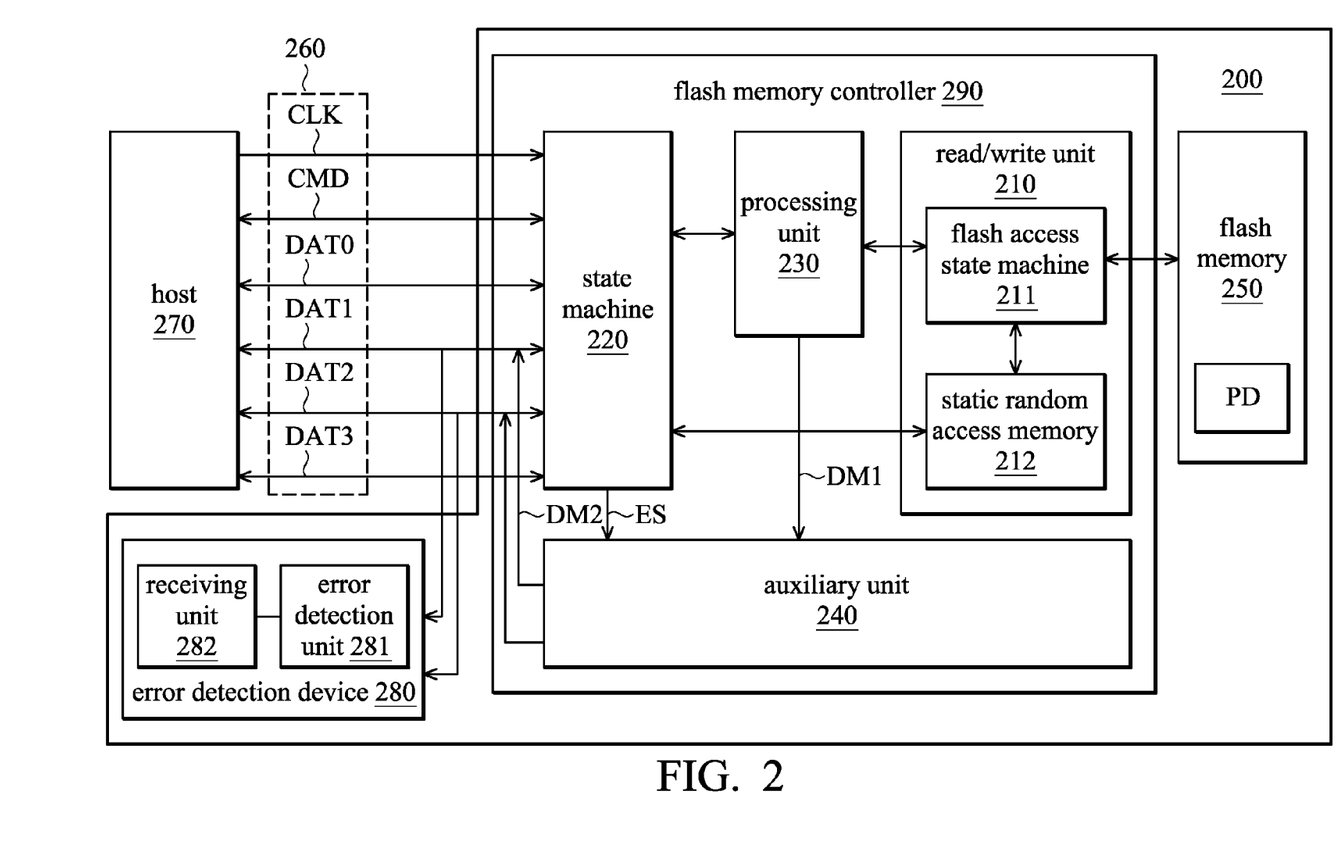
FIG. 2 is a schematic view showing a flash memory system of the invention.

FIG. 2 is a schematic view showing a flash memory system 200 of the invention. As shown in FIG. 2, the flash memory system 200 comprises a flash memory 250, a flash memory controller 290 and an error detection device 280. The flash memory 250 is the same as the flash memory 150, and the flash memory controller 290 (i.e., read/write unit 210, a state machine 220, a processing unit 230 and an auxiliary unit 240) is the same as the flash memory controller 190 (i.e., the read/write unit 110, the state machine 120, the processing unit 130 and the auxiliary unit 140), and thus, details thereof are omitted for brevity. The combination of the flash memory 250 and the flash memory controller 290 is referred to as the embedded multimedia card (EMMC) coupled to the host 270. In other words, the flash memory 250, the flash memory controller 290 and the host 270 are located on the same printed circuit board.

It should be noted that the error detection device 280 comprises an error detection unit 280 and a receiving unit 282. Specifically, the detection unit 281 is configured to determine whether the signal from the data lines DAT1 and DAT2 is the error detection message DM2 by a differential signal check method, a parity check method and a baud rate check method, thereby preventing the write signal and the read signal between the host 270 and the state machine 220 from being mistakenly identified with the error detection message DM2.

Specifically, in the differential signal check method, when the signals outputted from the data line DAT1 and the data line DAT2 are signal TX+ and signal TX− (or signal TX− and signal TX+), respectively, the detection unit 281 recognizes the signals from the data lines DAT1 and DAT2 as the error detection message DM2, and the detection unit 281 outputs the error detection message DM2 to the receiving unit 282. In addition, the detection unit 281 determines whether the signals from the data lines DAT1 and DAT2 represent the error detection message DM2 using the parity check method at the same time. When the signals from the data lines DAT1 and DAT2 meet the parity check, the detection unit 281 determines that the differential signals are serving as the error detection message DM2, and outputs the error detection message DM2 to the receiving unit 282.

In the baud rate check method, the error detection unit 280 and the auxiliary unit 240 are set to operate at a predetermined baud rate. The auxiliary unit 240 outputs an error detection message DM2 to the error detection device 280 at the predetermined baud rate (19200 bps or 38400 bps), which differs from the transmission speed (9600 bps) of embedded multimedia card. In other words, the detection unit 281 transmits the received messages to the receiving unit 282 merely within the scope of predetermined baud rate to prevent incorrect operations of the receiving unit 282. The error detection device 280 and the auxiliary unit 240 both use the differential signal check method, the parity check method and the baud rate check method at the same time to prevent mistakenly identifying the write signal and the read signal between the host 270 and the state machine 220 as the error detection message DM2, thereby, increasing the accuracy rate of the error detection device 280.

In view of this, when the processing data is function f(g(h(x))), the processing unit 230 writes string ST (i.e. strings ST1, ST2 and ST3) to each function (i.e. f(x), g(x) and h(x)), such that when the processing unit 230 performs the function f(x), the processing unit 230 transmits the string ST1 (i.e. the error detection message DM1) to the auxiliary unit 240, and the auxiliary unit 240 transmits the error detection message DM2 comprising the string ST1 to the error detection device 280 at the proper time (for example, prior to the flash controller transmitting the reading data or after the flash memory controller completes the writing data transmission). When the function h(x) is an incorrect function, the error detection device 280 merely receives the strings ST1 and ST2 without the error detection message DM2 of the string ST3. Thus, the error detection device 280 can identify that the function h(x) has some errors according to the error detection message DM2. In some embodiments, the error detection device 280 can display the symbol(s) corresponding to the error detection message DM2 via some devices (for example, a monitor), then a program designer can modify the function h(x) according to the displayed symbol, such that the flash memory controller 290 can operate in normal condition.

Figure 3:
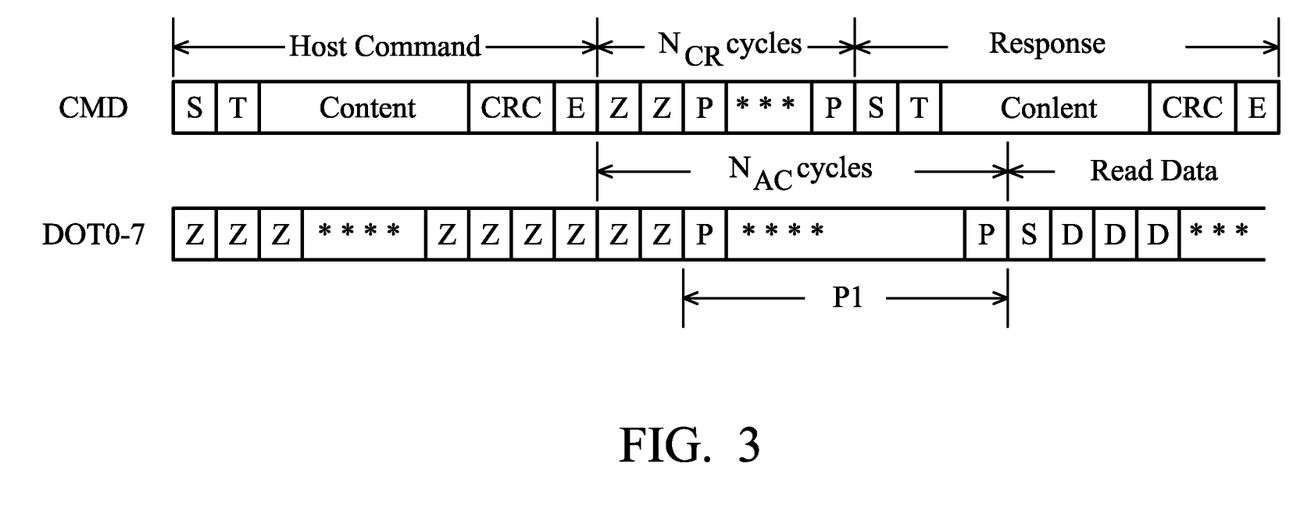
FIG. 3 is a reading timing diagram showing an embedded multimedia card state machine of the invention.

FIG. 3 is a reading timing diagram showing an embedded multimedia card state machine of the invention. As shown in FIG. 3, when the state machine 120 is an embedded multimedia card state machine, before the flash memory controller 190 enables a reading data transmission (for example, the access time delay or the period P1), the auxiliary unit 140 outputs the string ST through data lines DAT1 and DAT2 to the error detection device 280. In addition, when the state machine 120 is a secure digital memory card state machine, before the flash memory controller 190 enables a reading data transmission (similar to the period P1), the auxiliary unit 140 outputs the string ST through the data lines DAT1 and DAT2 to the error detection device 280

Figure 4:
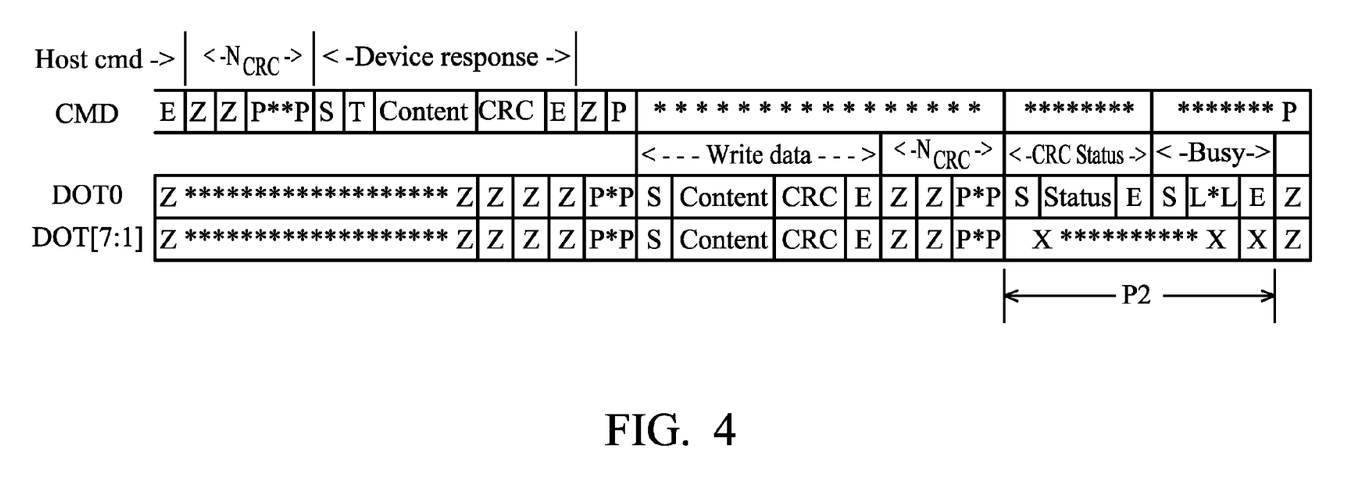
FIG. 4 is another reading timing diagram showing an embedded multimedia card state machine of the invention.

FIG. 4 is a reading timing diagram showing an embedded multimedia card state machine of the invention. As shown in FIG. 4, when state machine 220 is an embedded multimedia card state machine, after the writing data transmission of the flash memory controller 290 is completed (for example, the period P2), the auxiliary unit 240 outputs the string ST through data lines DAT1 and DAT2. For example, the period P2 includes a busy status period and a cyclical redundancy check status period.

Figure 5:
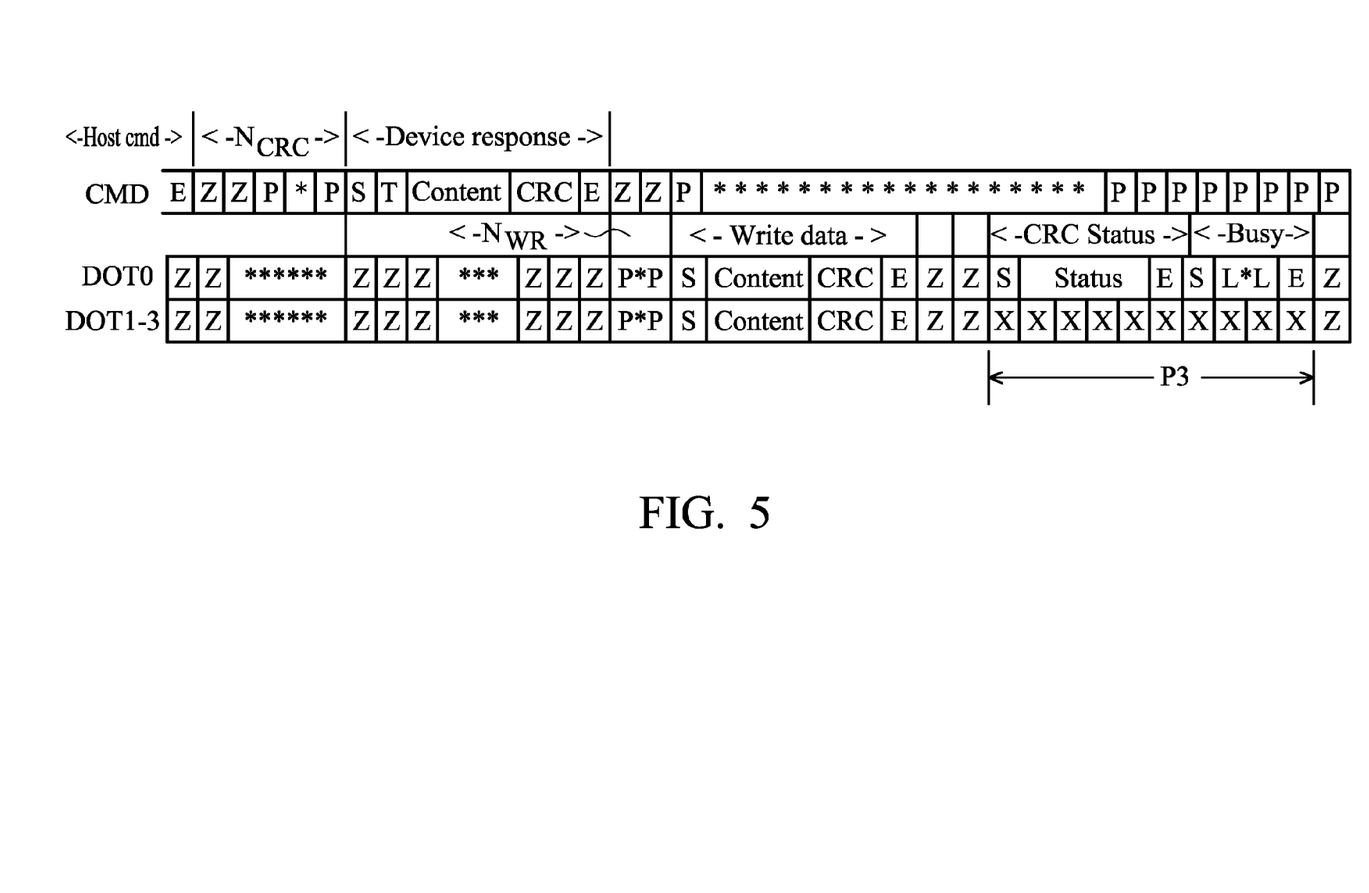
FIG. 5 is another reading timing diagram showing a secure digital memory card state machine of the invention.

FIG. 5 is a reading timing diagram showing a secure digital memory card state machine of the invention. As shown in FIG. 5, when state machine 220 is a secure digital memory card state machine, after the writing data transmission of the flash memory controller 290 is completed (for example, the period P3), the auxiliary unit 240 outputs the string ST through data lines DAT1 and DAT2. For example, the period P3 includes a busy status period and a cyclical redundancy check status period.

Figure 6:
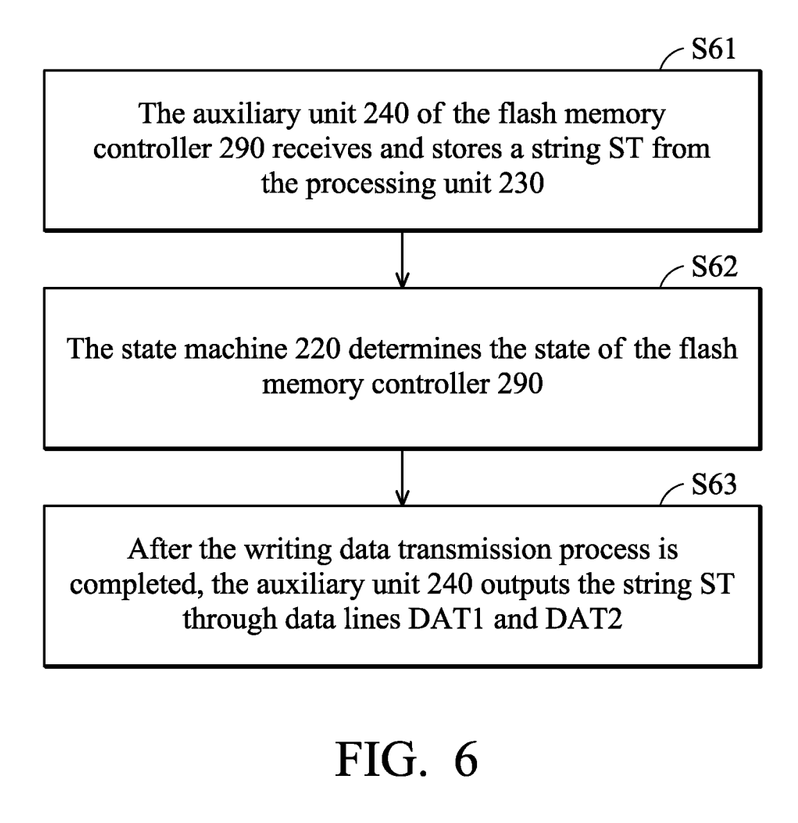
FIG. 6 is a flowchart of the error detection method of the invention.

FIG. 6 is a flowchart of the error detection method of the invention. As shown in FIG. 6, the error detection method comprises the following steps.

In step S61, the auxiliary unit 240 of the flash memory controller 290 receives and stores a string ST from the processing unit 230. In step S62, the state machine 220 determines the state of the flash memory controller 290. In step 63, after the writing data transmission is completed, the auxiliary unit 240 outputs the string ST through data lines DAT1 and DAT2.

Figure 7:
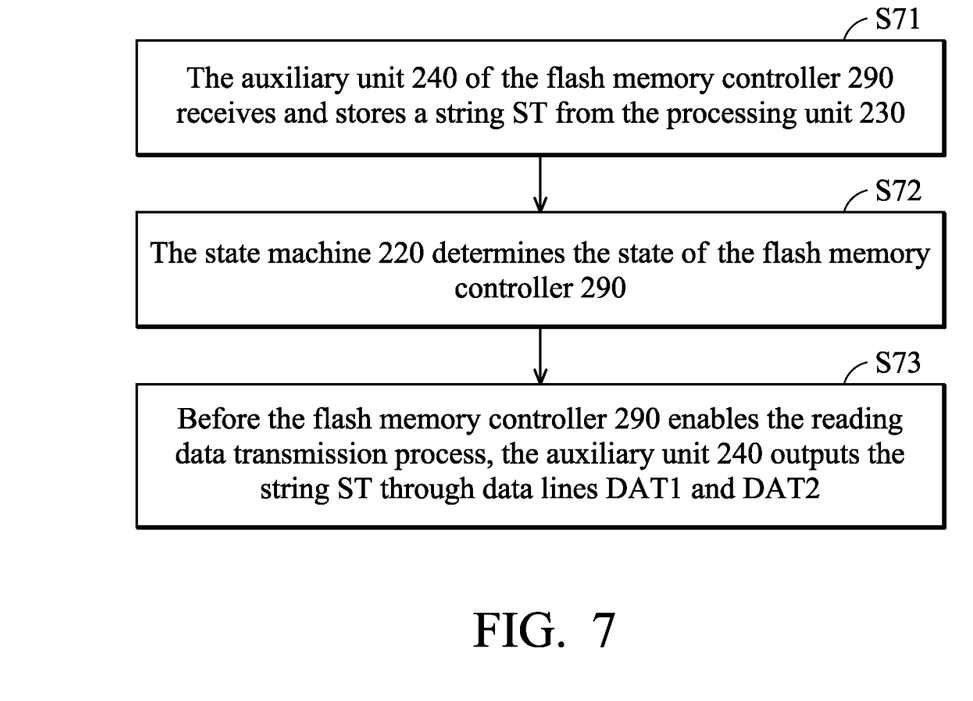
FIG. 7 is another flowchart of the error detection method of the invention.

FIG. 7 is another flowchart of the error detection method of the invention. Steps S71 and S72 are the same as steps S61 and S62, and the difference between the methods shown in FIGS. 6 and 7 is step S73. In step S73, before the flash memory controller 290 enables the reading data transmission, the auxiliary unit 240 outputs the string ST through data lines DAT1 and DAT2.

In summary, because the flash memory 200 of the invention can output the error detection string of the processing data PD to the error detection device 280, the error detection device 280 can identify the parts of the processing data PD processed by the processing unit 230, such that the error content in the processing data PD can be found quickly. Moreover, the error detection method of the invention adopts the differential signal check method, the parity check method and the baud rate check method, so that the error detection device 280 can more precisely receive the error detection message DM2 without mistakenly identifying the messages between the state machine 220 and the host 270 as the error detection massage DM2.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory controller, comprising:
    a read/write unit, connected to a flash memory and configured to perform a writing command or a reading command;
    a state machine, configured to determine a state of the flash memory controller;
    a processing unit, connected to the read/write unit and the state machine and configured to control the read/write unit; and
    an auxiliary unit, connected to first and second data lines and the processing unit, and configured to receive and store a string output from the processing unit;
    wherein the auxiliary unit outputs the string through the first and second data lines after the flash memory controller completes a writing data transmission.

2. The flash memory controller as claimed in claim 1, wherein the state machine outputs an enabling signal to the auxiliary unit when the flash memory controller is in a busy state.

3. The flash memory controller as claimed in claim 1, wherein the auxiliary unit is suspended when receiving a sleeping signal.

4. The flash memory controller as claimed in claim 1, wherein the auxiliary unit outputs the string through the first and second data lines in a manner compatible with the universal asynchronous receiver/transmitter standard.

5. The flash memory controller as claimed in claim 1, wherein the auxiliary unit outputs the string through the first and second data lines using differential signals.

6. The flash memory controller as claimed in claim 1, wherein the auxiliary unit adds a parity check code to the string.

7. The flash memory controller as claimed in claim 1, wherein the auxiliary unit outputs the string to an error detection device at a predetermined baud rate, and the predetermined baud rate is different from a transmitting speed between the state machine and a host.

8. The flash memory controller as claimed in claim 1, wherein the read/write unit comprises:
    a flash access state machine, configured to read processing data from the flash memory; and
    a static random access memory, configured to store the processing data.

9. The flash memory controller as claimed in claim 1, wherein completing the writing data transmission is to complete a writing data transmission on the first and second data lines.

10. The flash memory controller as claimed in claim 1, wherein the first data line is DAT1 and the second data line is DAT2.

11. The flash memory controller as claimed in claim 1, wherein the auxiliary unit is further connected to a third data line and the auxiliary unit determines whether a writing data transmission on the first and second data lines is completed according to the third data line.

12. The flash memory controller as claimed in claim 11, wherein the third data line is DAT0.

13. An error detection method, suitable for a flash memory and a flash memory controller having a read/write unit, a state machine and a processing unit, the error detection method comprising:
    receiving and storing a string from the processing unit by an auxiliary unit of the flash memory controller;

determining a state of the flash memory controller by the state machine; and outputting the string through first and second data lines by the auxiliary unit, after a writing data transmission is completed by the flash memory controller.

14. The error detection method as claimed in claim 13, further comprising:

outputting an enabling signal to the auxiliary unit when the flash memory controller is in a busy state.

15. The error detection method as claimed in claim 13, further comprising:

suspending the auxiliary unit, when receiving a sleeping signal.

16. The error detection method as claimed in claim 13, wherein the auxiliary unit outputs the string through the first and second data lines in a manner compatible with the universal asynchronous receiver/transmitter standard.

17. The error detection method as claimed in claim 13, wherein the auxiliary unit outputs the string through the first and second data lines using differential signals.

18. The error detection method as claimed in claim 13, wherein the auxiliary unit adds a parity check code to the string.

19. The error detection method as claimed in claim 13, wherein the auxiliary unit outputs the string to an error detection device at a predetermined baud rate, and the predetermined baud rate is different from a transmitting speed between the state machine and a host.

20. The error detection method as claimed in claim 13, wherein completing the writing data transmission is to complete a writing data transmission on the first and the second data lines.

21. The error detection method as claimed in claim 13, wherein the first data line is DAT1 and the second data line is DAT2.

22. The error detection method as claimed in claim 13, wherein the auxiliary unit is further connected to a third data line and the auxiliary unit determines whether a writing data transmission on the first and second data lines is completed according to the third data line.

23. The error detection method as claimed in claim 22, wherein the third data line is DAT0.

24. A flash memory controller, comprising:

a read/write unit, connected to a flash memory and configured to perform a writing command or a reading command;

a state machine, configured to determine a state of the flash memory controller;

a processing unit, connected to the read/write unit and the state machine and configured to control the read/write unit and an auxiliary unit, connected to first and second data lines and the processing unit, and configured to receive and store a string output from the processing unit;

wherein the auxiliary unit outputs the string through the first and second data lines before the flash memory controller enables a reading data transmission.

25. The flash memory controller as claimed in claim 24, wherein the state machine outputs an enabling signal to the auxiliary unit when the flash memory controller is in an access delay time.

26. The flash memory controller as claimed in claim 24, wherein the auxiliary unit suspends operations when receiving a sleeping signal.

27. The flash memory controller as claimed in claim 24, wherein the auxiliary unit outputs the string through the first and second data lines in a manner compatible with the universal asynchronous receiver/transmitter standard.

28. The flash memory controller as claimed in claim 24, wherein the auxiliary unit outputs the string through the first and second data lines with the differential signals.

29. The flash memory controller as claimed in claim 24, wherein the auxiliary unit adds a parity check code to the string.

30. The flash memory controller as claimed in claim 24, wherein the auxiliary unit outputs the string to an error detection device at a predetermined baud rate, and the predetermined baud rate is different from a transmitting speed between the state machine and a host.

31. The flash memory controller as claimed in claim 24, wherein the read/write unit comprises:

a flash access state machine, configured to read processing data from the flash memory; and a static random access memory, configured to store the processing data.

32. The flash memory controller as claimed in claim 24, wherein enabling the reading data transmission is to enable a reading data transmission on the first and second data lines.

33. The flash memory controller as claimed in claim 24, wherein the first data line is DAT1 and the second data line is DAT2.

34. The flash memory controller as claimed in claim 24, wherein the auxiliary unit is further connected to a third data line and the auxiliary unit determines whether the reading data transmission on the first and second data lines is enabled according to the third data line.

35. The flash memory controller as claimed in claim 34, wherein the third data line is DAT0.

36. An error detection method, suitable for a flash memory and a flash memory controller having a read/write unit, a state machine and a processing unit, the error detection method comprising:

receiving and storing a string from the processing unit by an auxiliary unit of the flash memory controller;

determining a state of the flash memory controller by the state machine; and outputting the string through first and second data lines by the auxiliary unit, before the flash memory controller enables a reading data transmission.

37. The error detection method as claimed in claim 36, further comprising:

outputting an enabling signal to the auxiliary unit when the flash memory controller is in a reading delay time.

38. The error detection method as claimed in claim 36, further comprising:

suspending the auxiliary unit, when receiving a sleeping signal.

39. The error detection method as claimed in claim 36, wherein the auxiliary unit outputs the string through the first and second data lines in a manner compatible with the universal asynchronous receiver/transmitter standard.

40. The error detection method as claimed in claim 36, wherein the auxiliary unit outputs the string through the first and second data lines with the differential signals.

41. The error detection method as claimed in claim 36, wherein the auxiliary unit adds a parity check code to the string.

42. The error detection method as claimed in claim 36, wherein the auxiliary unit outputs the string to an error detection device at a predetermined baud rate, and the predetermined baud rate is different from a transmitting speed between the state machine and a host.

43. The error detection method as claimed in claim 36, wherein enabling the reading data transmission is to enable a reading data transmission on the first and the second data lines.

44. The error detection method as claimed in claim 36, wherein the first data line is DAT1 and the second data line is DAT2.

45. The error detection method as claimed in claim 36, wherein the auxiliary unit is further connected to a third data line and the auxiliary unit determines whether the reading data transmission on the first and second data lines is enabled according to the third data line.

46. The error detection method as claimed in claim 45, wherein the third data line is DAT0.

\* \* \* \* \*